United States Patent
Shearer et al.

(10) Patent No.: US 10,249,533 B1
(45) Date of Patent: Apr. 2, 2019

(54) METHOD AND STRUCTURE FOR FORMING A REPLACEMENT CONTACT

(71) Applicant: International Business Machines Corporation, Armonk, NY (US)

(72) Inventors: Jeffrey Shearer, Albany, NY (US); John R. Sporre, Albany, NY (US); Nicole A. Saulnier, Albany, NY (US); Hyung Joo Shin, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/951,787

(22) Filed: Apr. 12, 2018

(51) Int. Cl.
| | |
|---|---|
| H01L 21/44 | (2006.01) |
| H01L 21/768 | (2006.01) |
| H01L 21/8234 | (2006.01) |
| H01L 23/535 | (2006.01) |
| H01L 29/66 | (2006.01) |
| H01L 27/088 | (2006.01) |

(52) U.S. Cl.
CPC ......... *H01L 21/76897* (2013.01); *H01L 21/823431* (2013.01); *H01L 21/823468* (2013.01); *H01L 21/823475* (2013.01); *H01L 23/535* (2013.01); *H01L 27/0886* (2013.01); *H01L 29/66545* (2013.01)

(58) Field of Classification Search
None
See application file for complete search history.

(56) References Cited

U.S. PATENT DOCUMENTS

| | | |
|---|---|---|
| 8,357,978 B1 | 1/2013 | Baars et al. |
| 8,536,040 B1 | 9/2013 | Park |
| 8,741,718 B2 | 6/2014 | Sardesai |
| 9,054,178 B2 | 6/2015 | Bohr et al. |
| 9,093,467 B1 | 7/2015 | Xie et al. |
| 9,257,529 B2 | 2/2016 | Metz |
| 9,673,101 B2 | 6/2017 | Ok et al. |
| 9,685,532 B2 | 6/2017 | Basker et al. |
| 10,056,289 B1 * | 8/2018 | Cheng ............... H01L 21/764 |
| 2005/0124103 A1 * | 6/2005 | Gil .................. H01L 21/76802 438/197 |

OTHER PUBLICATIONS

Seo et al., "Full Metal Gate with Borderless Contact for 14 nm and Beyond," Symposium on VLSI Technology Digest of Technical Papers, 2011, pp. 36-37.
Jacob et al., "Scaling Challenges for Advanced CMOS Devices," International Journal of High Speed Electronics and Systems, 2017, 76 pages, vol. 26, No. 01.

* cited by examiner

*Primary Examiner* — Thien F Tran
(74) *Attorney, Agent, or Firm* — Vazken Alexanian; Ryan, Mason & Lewis, LLP

(57) ABSTRACT

A method for manufacturing a semiconductor device includes forming a plurality of gate structures spaced apart from each other on a fin, forming an inorganic plug portion on the fin between at least two gate structures of the plurality of gate structures, forming a dielectric layer on the fin and between remaining gate structures of the plurality of gate structures, forming an organic planarizing layer (OPL) on the plurality of gate structures and on the inorganic plug portion, removing a portion of the OPL to expose the inorganic plug portion, selectively removing the inorganic plug portion, and forming a contact on the fin in place of the removed inorganic plug portion.

20 Claims, 16 Drawing Sheets

METHOD AND STRUCTURE FOR FORMING A REPLACEMENT CONTACT

TECHNICAL FIELD

The field generally relates to semiconductor devices and methods of manufacturing same and, in particular, to forming a contact that replaces an inorganic plug portion.

BACKGROUND

In conventional processing of semiconductor devices, such as fin field-effect transistor (FinFET) devices, nanosheet devices or vertical field-effect transistor (VFET) devices, current middle of line (MOL) contact schemes require selectively removing an intra-gate material (material between gate structures) selective to a gate hard mask material. Typically, this includes removing an oxide selective to a nitride.

Achieving selective etching between two inorganic materials like an oxide and a nitride is very difficult, and at times, may not be possible. The inability to selectively etch intra-gate material with respect to gate hard mask material can cause erosion of gate hard mask material, which can lead to shorts between contacts and gates. In addition, loss of the gate hard mask material can result in gate height loss. One solution is to increase hard mask height, but that forces incoming gate height to be increased, which increases the stresses placed on gate patterning and structural stability.

Creating a robust self-aligned contact (SAC) oxide etch that is selective to a nitride gate cap and gate spacer is very challenging and relies on many factors, such as, for example, incoming SAC cap height, aspect ratio of the contact, and overlap of the nitride cap and spacers. A successful SAC etch requires precise polymer formation on the gate cap. Not enough polymer will prevent sufficient protection, and too much polymer will result in an etch stop. Furthermore, polymer balance can change if contact-to-gate alignment changes or if the space between gates changes. The problem is further complicated by the fact that selectivity between oxides and nitrides is finite, and oxides and nitrides may be etched under similar plasma conditions.

Accordingly, there is a need for improved methods to address the limitations of removing an intra-gate material selective to a gate hard mask material when forming contact structures.

SUMMARY

According to an exemplary embodiment of the present invention, a method for manufacturing a semiconductor device includes forming a plurality of gate structures spaced apart from each other on a fin, forming an inorganic plug portion on the fin between at least two gate structures of the plurality of gate structures, forming a dielectric layer on the fin and between remaining gate structures of the plurality of gate structures, forming an organic planarizing layer (OPL) on the plurality of gate structures and on the inorganic plug portion, removing a portion of the OPL to expose the inorganic plug portion, selectively removing the inorganic plug portion, and forming a contact on the fin in place of the removed inorganic plug portion.

According to an exemplary embodiment of the present invention, a method for manufacturing a semiconductor device includes forming a plurality of sacrificial gates spaced apart from each other on a fin, depositing an organic planarizing layer (OPL) on the fin and between the plurality of sacrificial gates, removing a portion of the OPL from between at least two sacrificial gates of the plurality of sacrificial gates, forming an inorganic plug portion on the fin in an area where the portion of the OPL was removed, removing a remaining portion of the OPL, depositing a dielectric layer on the fin and between the plurality of sacrificial gates where the OPL was removed, replacing the plurality of sacrificial gates with a plurality of gate structures, selectively removing the inorganic plug portion, and forming a contact on the fin in place of the removed inorganic plug portion.

According to an exemplary embodiment of the present invention, a method for manufacturing a semiconductor device includes forming a plurality of gate structures spaced apart from each other on a channel region, forming a plug portion on the channel region between at least two gate structures of the plurality of gate structures, forming a dielectric layer on the channel region and between remaining gate structures of the plurality of gate structures, forming an organic planarizing layer (OPL) on the plurality of gate structures, the plug portion and the dielectric layer, removing a portion of the OPL to expose the plug portion, selectively removing the plug portion, and forming a contact on the fin in place of the removed plug portion.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
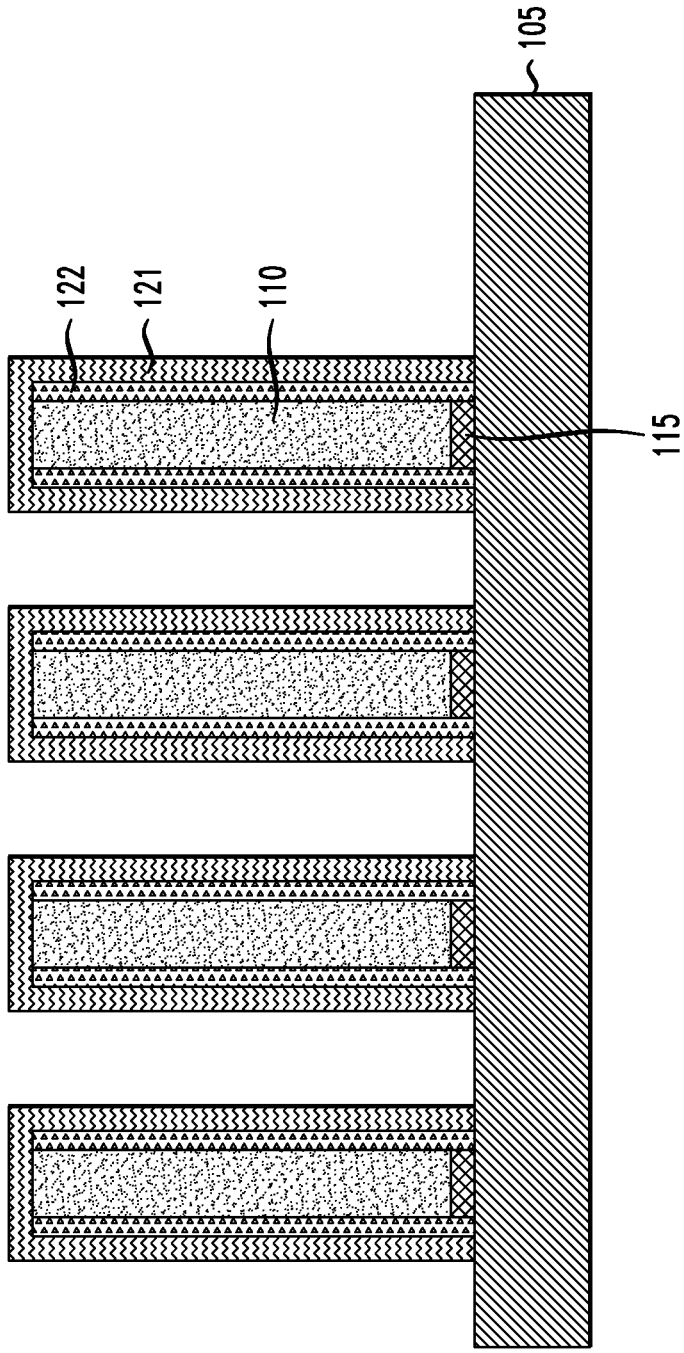
FIG. 1 is a cross-sectional view illustrating sacrificial gates formed on a fin in a method of manufacturing a semiconductor device, according to an exemplary embodiment of the present invention.

Exemplary embodiments of the invention will now be discussed in further detail with regard to semiconductor devices and methods of manufacturing same and, in particular, to methods using an organic planarizing layer (OPL) when forming a contact that replaces an inorganic plug portion.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), fin field-effect transistor (FinFET), nanowire FET, nanosheet FET, metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the underlying layer (e.g., fin) in the cross-sectional views, and "horizontal" refers to a direction parallel to the top surface of the underlying layer (e.g., fin) in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FinFET devices include a transistor architecture that uses raised source-to-drain channel regions, referred to as fins. A FinFET device can be built on a semiconductor substrate, where a semiconductor material, such as Si and/or SiGe, is patterned into fin-like shapes and functions as the channels of the transistors. Some FinFET devices include fins with source/drain regions on lateral sides of the fins, so that current flows in a horizontal direction (e.g., parallel to a substrate) between source/drain regions at opposite ends of the fins in the horizontal direction. Other FinFET devices include fins with source/drain regions on top and bottom sides of the fins, so that current flows in a vertical direction (e.g., perpendicular to a substrate) between source/drain regions at opposite ends of the fins in the vertical direction. While embodiments of the present invention are described in connection with gate structures formed on and around fins of FinFET devices and self-aligned contacts (SACs), such as source/drain contacts, for FinFET devices, the embodiments of the present invention are also applicable to forming SACs for other devices, including, but not necessarily limited to, nanowire FET, nanosheet FET and vertical FET devices.

Embodiments of the present invention utilize an organic material that can be selectively etched with respect to an inorganic plug portion formed in an area where a contact is to be located. Unlike etches between oxide and nitride materials, where etch selectivity is limited, the organic material has a high etch selectivity with respect to a variety of materials, including the inorganic plug portion. In addition, unlike conventional approaches, the embodiments of the present invention do not require additional mask sets. For example, the same mask that is described in connection with FIG. 2 can be used again in connection with the processing described in connection with FIG. 13.

FIG. 1 is a cross-sectional view illustrating sacrificial gates formed on a fin in a method of manufacturing a semiconductor device, according to an exemplary embodiment of the present invention. Referring to FIG. 1, which illustrates a cross-section along a length of a semiconductor fin 105 showing a plurality of gate regions formed on the fin 105. Each of the gate regions includes a gate dielectric 115, a sacrificial gate 110 formed on the gate dielectric 115, liner layers 122 and a spacer layer 121. According to an embodiment, the gate regions can be formed over and around the fin 105, and materials of the liner and spacer layers 122 and 121 are different from each other, where the spacer material can be etched selectively with respect to the liner material. In a non-limiting illustrative embodiment, the liner and spacer material includes but is not necessarily limited to silicon-oxygen-carbon-nitride (SiOCN), silicon-oxygen-boron-nitride (SiBCN), silicon oxycarbide (SiOC) and/or silicon carbide (SiC). In addition, the material of the sacrificial gate 110 includes, but is not necessarily limited to, amorphous silicon (a-Si) or polycrystalline silicon, and the material of the gate dielectric 115 includes, but is not necessarily limited to, an oxide, such as silicon oxide ($SiO_x$).

The fin 105 may be one of a plurality of fins spaced apart and patterned on or from a semiconductor substrate (not shown). In accordance with an embodiment of the present invention, the semiconductor substrate comprises, a semiconductor material including, but not necessarily limited to, silicon (Si), silicon carbide (SiC), Si:C (carbon doped silicon), II-V, III-V compound semiconductor or other like semiconductor. In addition, multiple layers of the semiconductor materials can be used as the semiconductor material of the substrate. In accordance with an embodiment of the present invention, the fin 105 includes a semiconductor material including, but not necessarily limited to, silicon, silicon germanium (SiGe), or germanium.

A semiconductor layer, which is patterned into a plurality of fins, such as fin 105, can be epitaxially grown on a semiconductor substrate. Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

While embodiments of the present invention describe channel regions as fins, the embodiments are not necessarily limited to fin channel regions, and may include nanowire or nanosheet channel regions.

Figure 2:
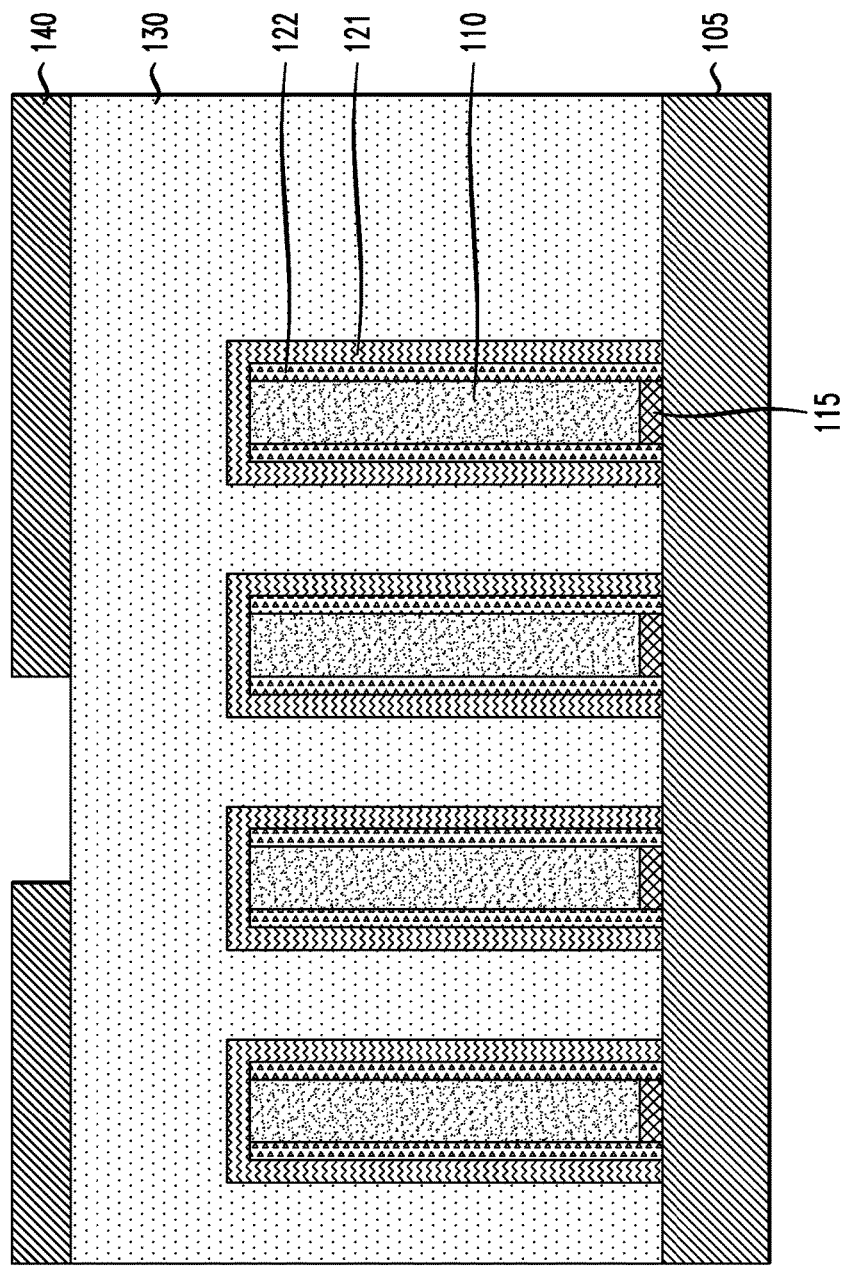
FIG. 2 is a cross-sectional view illustrating deposition of an organic planarizing layer (OPL) and a mask on the fin and between sacrificial gates in a method of manufacturing a semiconductor device, according to an exemplary embodiment of the present invention.

FIG. 2 is a cross-sectional view illustrating deposition of an organic planarizing layer (OPL) and a mask on the fin and between sacrificial gates in a method of manufacturing a semiconductor device, according to an exemplary embodiment of the present invention. Referring to FIG. 2, an OPL 130 is deposited on exposed portions of the fin 105 including areas between the gate regions. In accordance with an embodiment of the present invention, the OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 130 can be deposited, for example, by spin coating.

A mask 140 is formed on the OPL 130 exposing portions of the OPL 130 where a contact portion, such as a source/drain contact portion is to be formed. The mask 140 can be, for example, a photoresist used in connection with lithography, and exposed portions of the OPL 130 can be removed based on the pattern of the mask 140.

Figure 3:
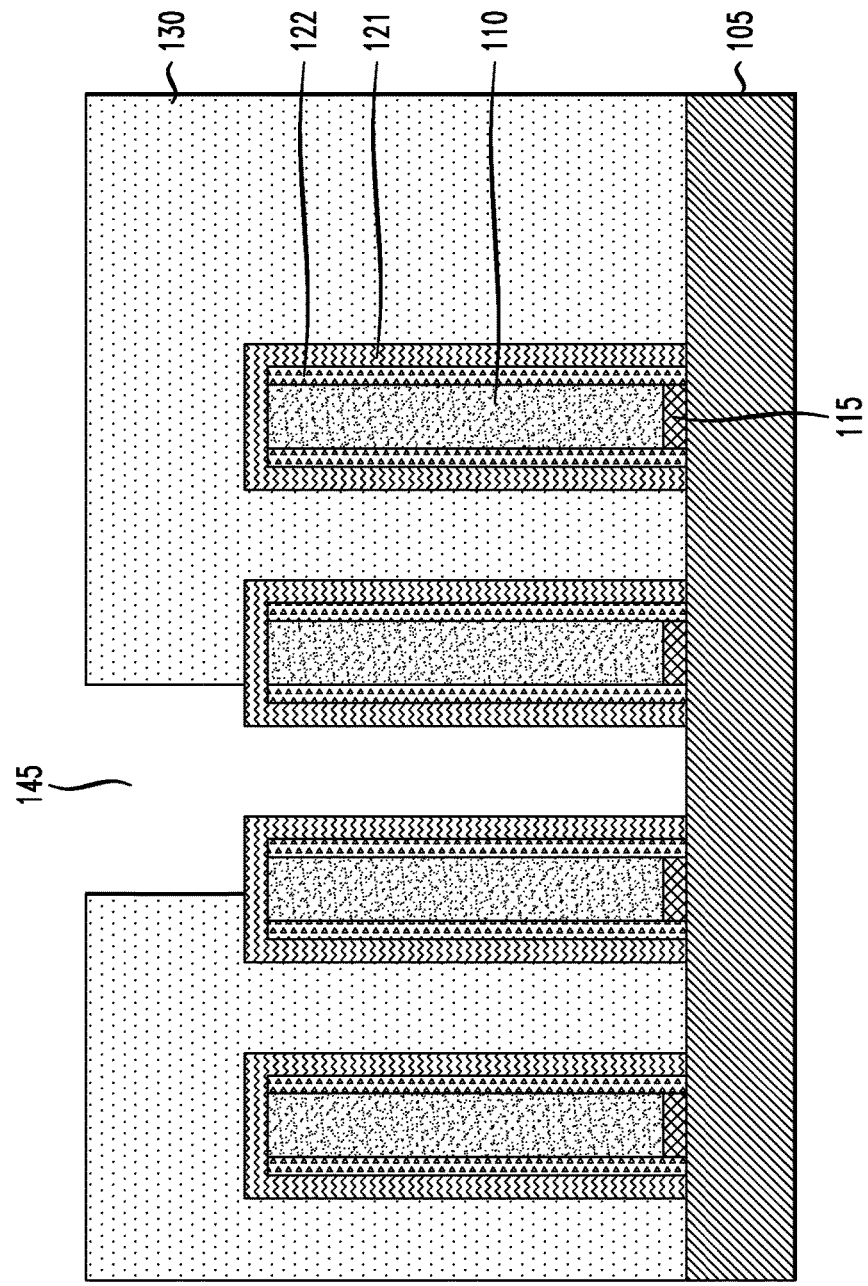
FIG. 3 is a cross-sectional view illustrating selective removal of a portion of the OPL to form an opening where a contact is to be formed in a method of manufacturing a semiconductor device, according to an exemplary embodiment of the present invention.

FIG. 3 is a cross-sectional view illustrating selective removal of a portion of the OPL to form an opening where a contact is to be formed in a method of manufacturing a semiconductor device, according to an exemplary embodiment of the present invention. Referring to FIG. 3, the exposed portions of the OPL 130 are removed to form a vacant area 145 between two gate regions down to a top surface of the fin 105. The removal of the exposed portions of the OPL 130 can be performed using, for example, an anisotropic removal process, such as, for example, a reactive ion etch (RIE) process, which is selective to materials of the gate region. For example, the etching is performed using $N_2/H_2$, $O_2$, $CO_2$, CO, or some combination thereof, which selectively etches the OPL 130 with respect to the spacer and liner layers 121 and 122. As noted above, the portion of the OPL 130 is removed from a region where a contact is to be formed.

Figure 4:
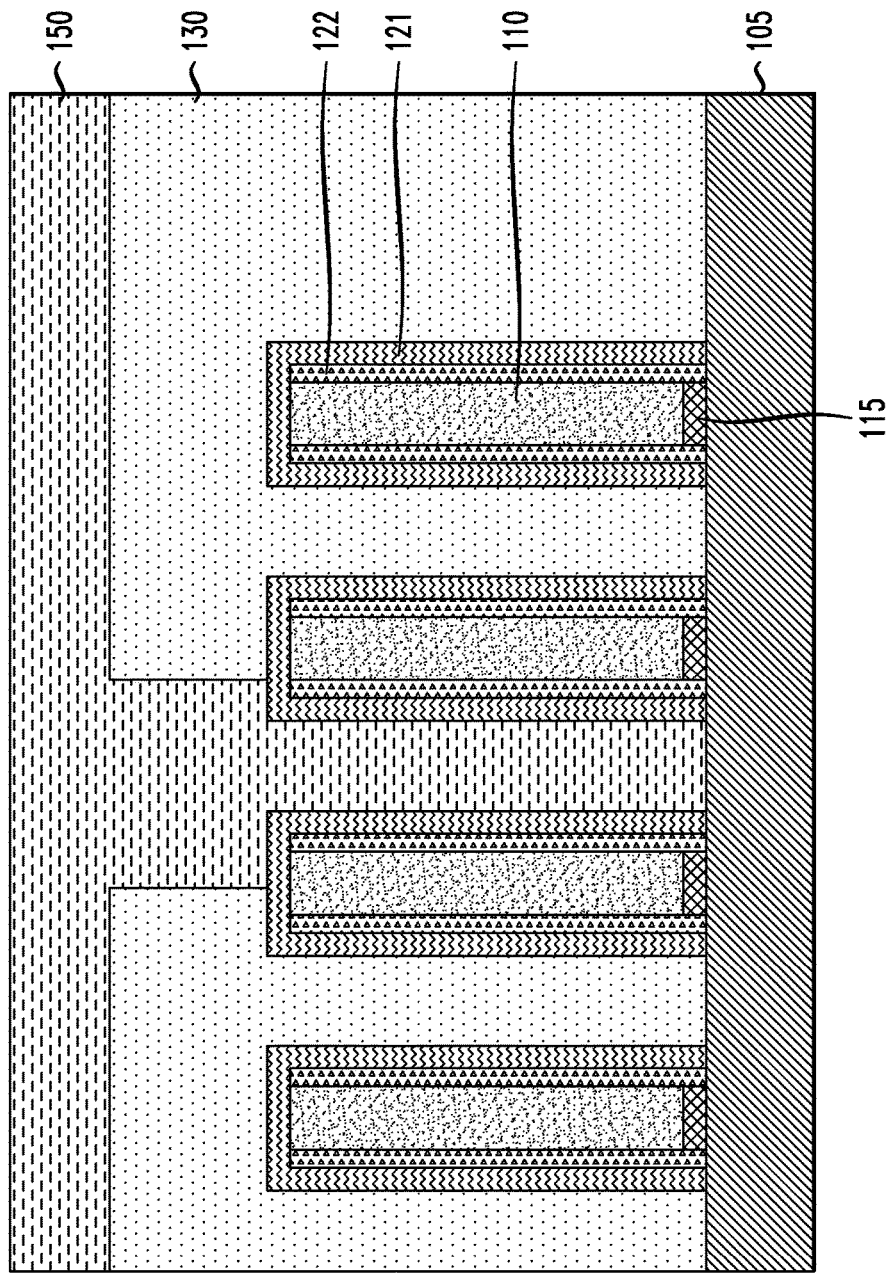
FIG. 4 is a cross-sectional view illustrating deposition in the opening from FIG. 3 of a plug material that can be selectively removed with respect to spacer and liner material in a method of manufacturing a semiconductor device, according to an exemplary embodiment of the present invention.

FIG. 4 is a cross-sectional view illustrating deposition in the opening from FIG. 3 of a plug material that can be selectively removed with respect to spacer and liner material in a method of manufacturing a semiconductor device, according to an exemplary embodiment of the present invention. Referring to FIG. 4, a plug material 150 is deposited in the area 145 where the OPL was removed and on the top surface of the OPL 130. The plug material 150 can be deposited using a deposition technique including, but not necessarily limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The plug material 150 includes, for example, $Si_3N_4$ or other relatively low temperature inorganic silicon nitride (SiN) material that can be removed selective to the spacer and liner layers 121 and 122. The relatively low temperature plug material 150 is deposited, for example, at a temperature ranging from room temperature to about 250° C., such as 200° C.

Figure 5:
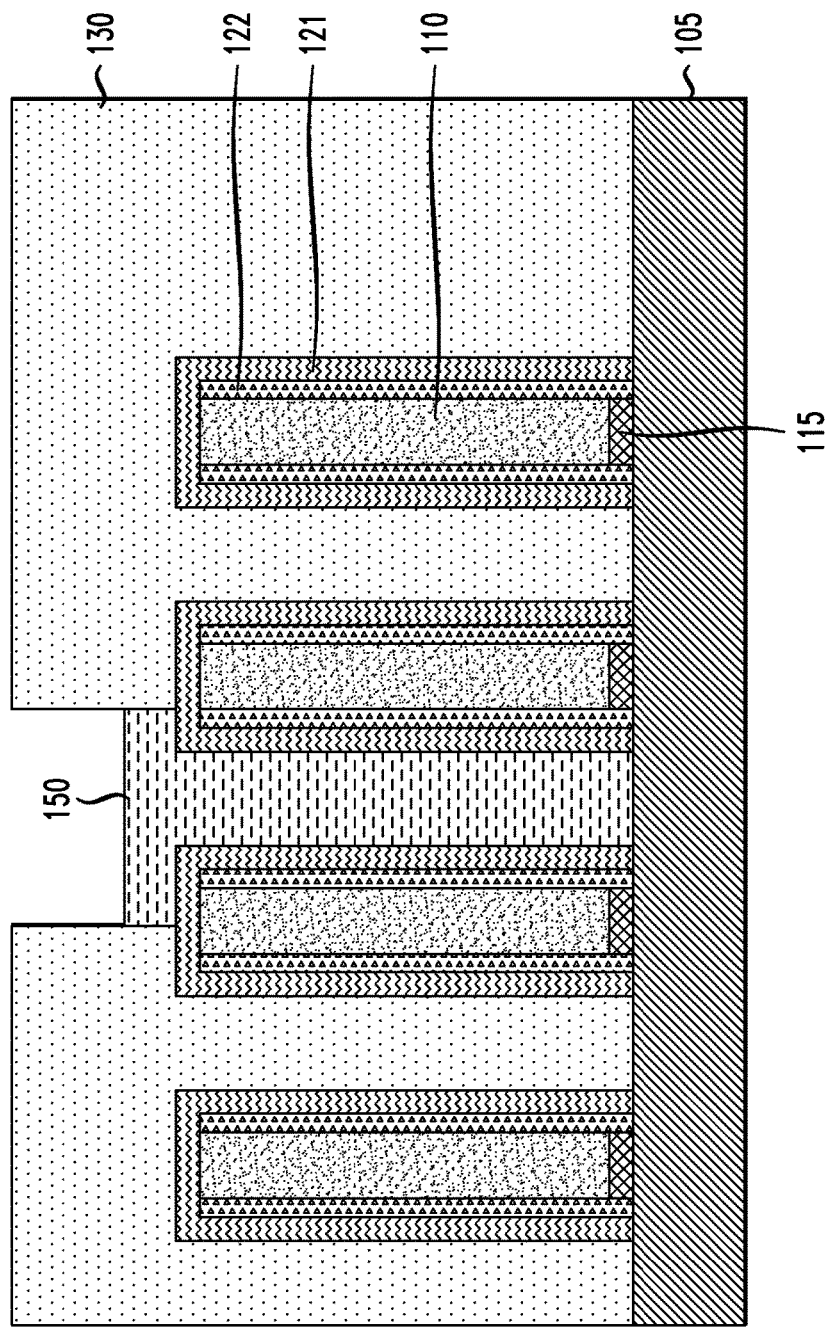
FIG. 5 is a cross-sectional view illustrating etch back of the deposited plug material from FIG. 4 to a height below a top surface of the OPL in a method of manufacturing a semiconductor device, according to an exemplary embodiment of the present invention.

FIG. 5 is a cross-sectional view illustrating etch back of the deposited plug material from FIG. 4 to a height below a top surface of the OPL in a method of manufacturing a semiconductor device, according to an exemplary embodiment of the present invention. Referring to FIG. 5, the plug material 150 is selectively etched back to a height below a top surface of the remaining portions of the OPL 130 and above top surfaces of the gate spacer layers 121. The etch back process selectively etches the plug material 150 with respect to the OPL 130.

Figure 6:
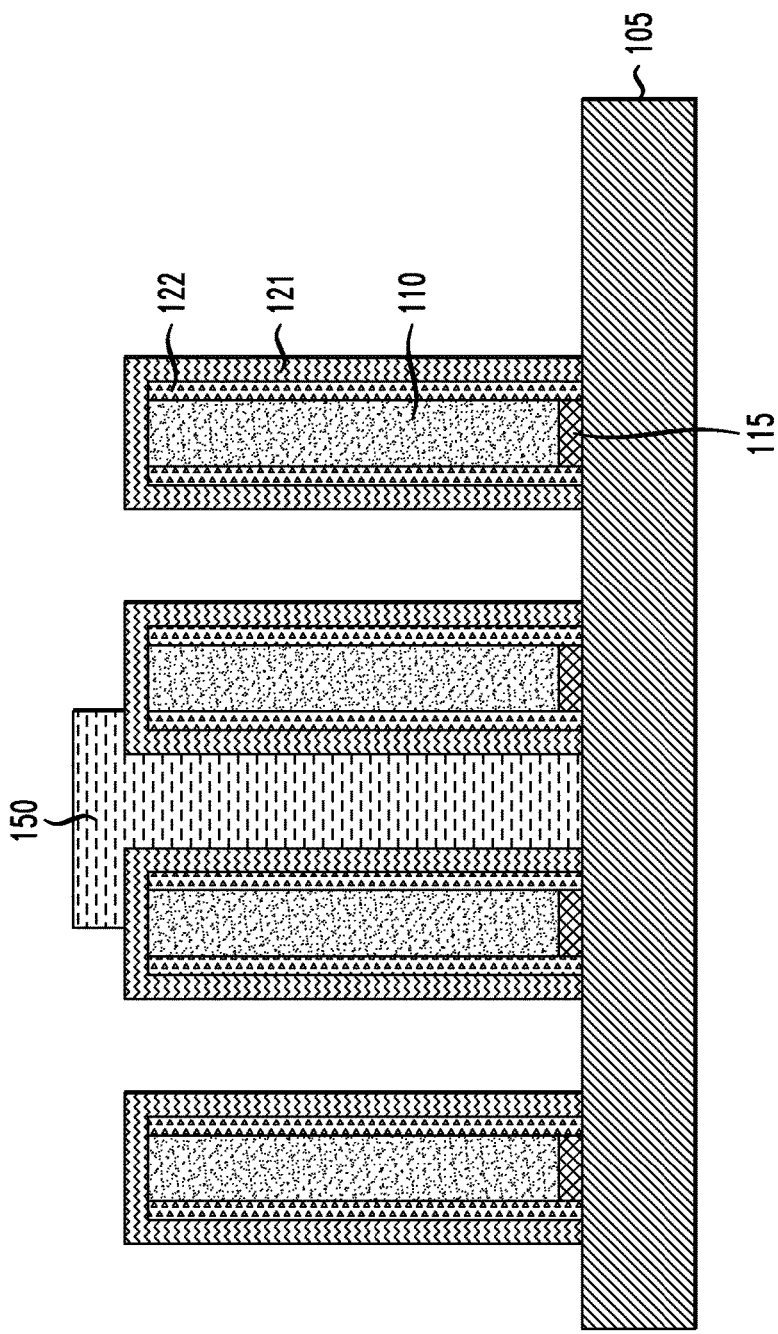
FIG. 6 is a cross-sectional view illustrating selective removal of remaining portions of the OPL in a method of manufacturing a semiconductor device, according to an exemplary embodiment of the present invention.

FIG. 6 is a cross-sectional view illustrating selective removal of remaining portions of the OPL in a method of manufacturing a semiconductor device, according to an exemplary embodiment of the present invention. Referring to FIG. 6, the remaining OPL 130 is removed from the fin 105 and from between the gate regions using, for example, an ashing process. The plug material 150 remains in the area where a contact is to be formed.

Figure 7:
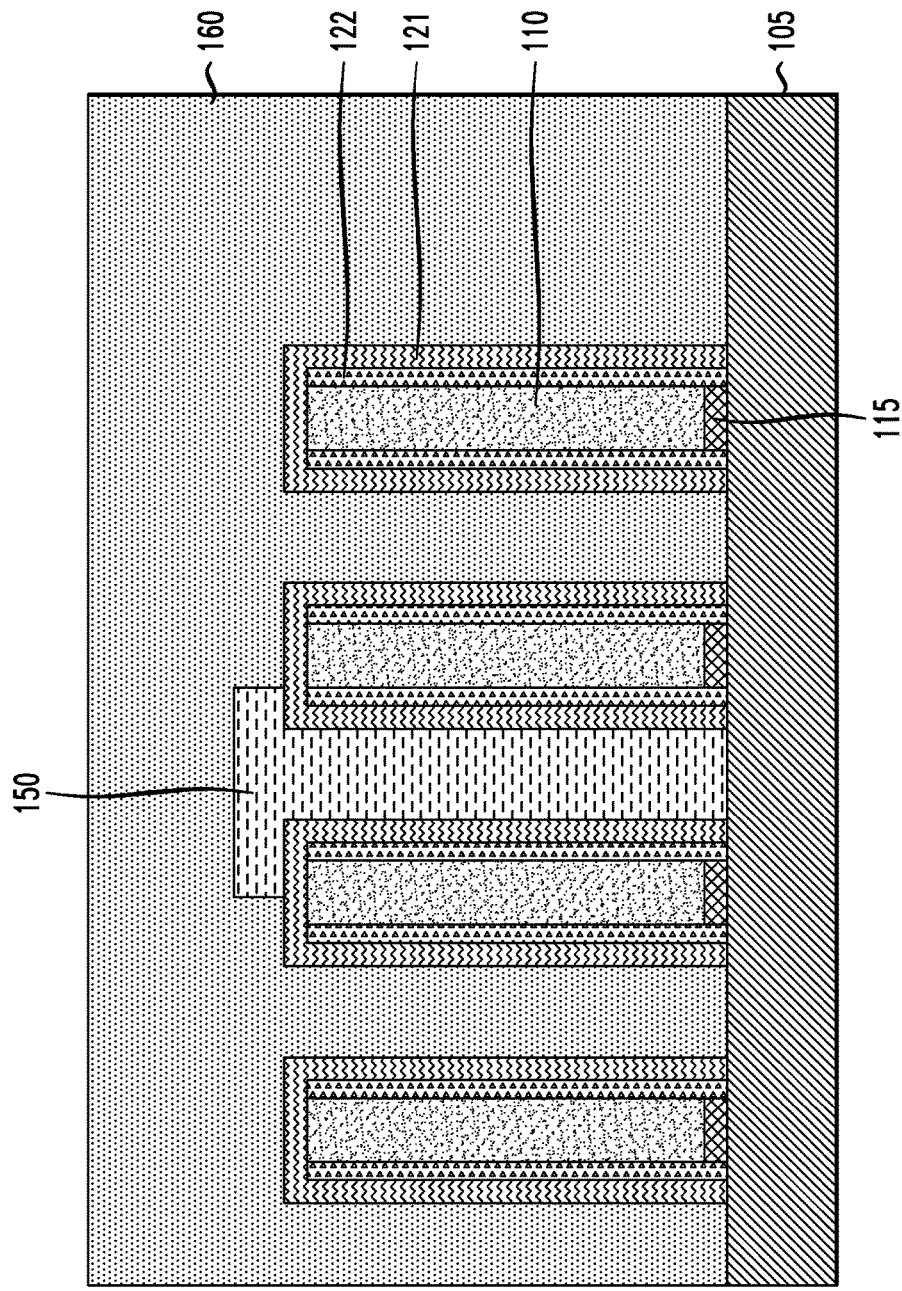
FIG. 7 is a cross-sectional view illustrating deposition of a dielectric layer in vacant areas on the fin, on the plug material and between sacrificial gates in a method of manufacturing a semiconductor device, according to an exemplary embodiment of the present invention.

FIG. 7 is a cross-sectional view illustrating deposition of a dielectric layer in vacant areas on the fin, on the plug material and between sacrificial gates in a method of manufacturing a semiconductor device, according to an exemplary embodiment of the present invention. Referring to FIG. 7, a dielectric layer 160 is deposited in vacant areas on the fin 105, on the plug material 150 and between sacrificial gates 110 including the spacer and liner layers 121 and 122 thereon. In accordance with an embodiment of the present invention, the dielectric layer is deposited using a deposition technique, including, but not necessarily limited to, CVD, PECVD, RFCVD, PVD, ALD, MLD, MBD, PLD, LSMCD, and/or sputtering, and includes, for example, $SiO_x$. As can be seen in FIG. 7, the dielectric 160 is deposited to a height above the gate regions and the plug material 150.

Figure 8:
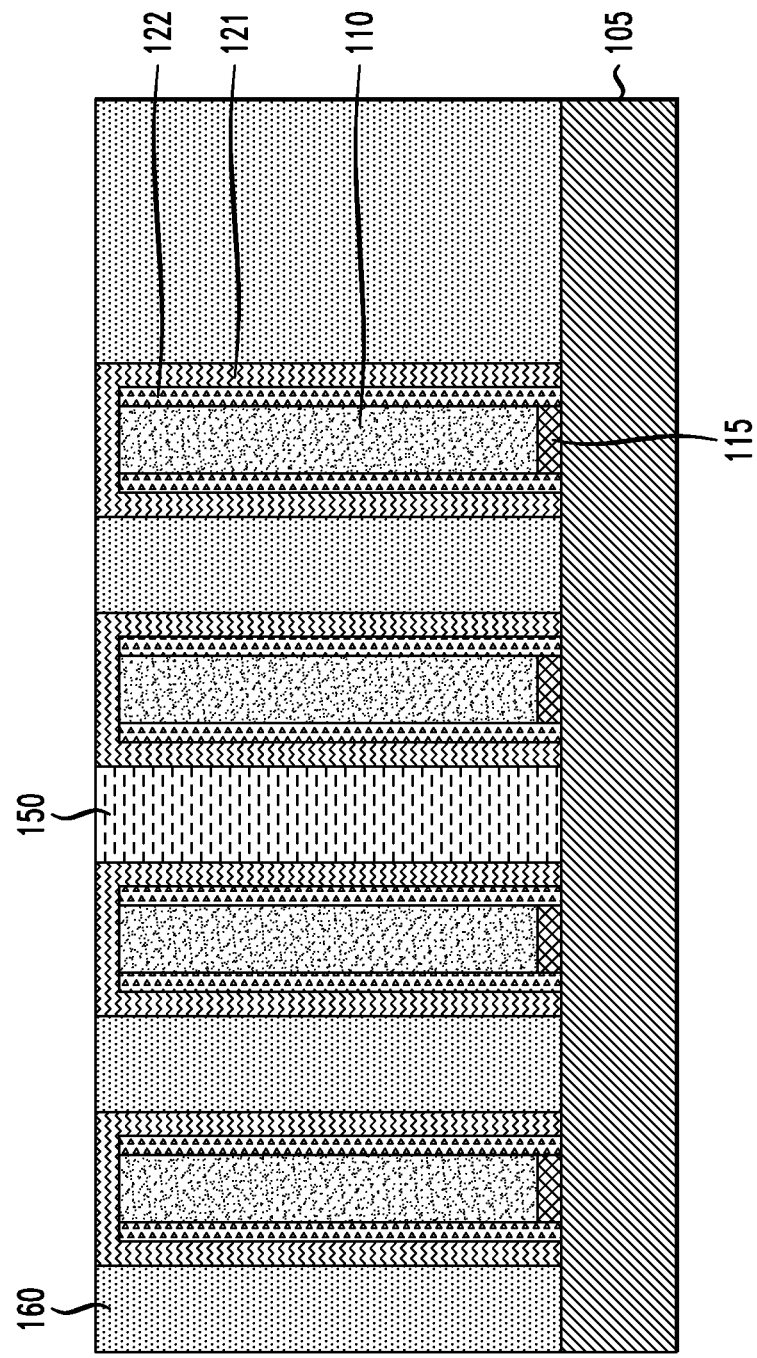
FIG. 8 is a cross-sectional view illustrating planarization of the dielectric layer and the plug material in a method of manufacturing a semiconductor device, according to an exemplary embodiment of the present invention.

FIG. 8 is a cross-sectional view illustrating planarization of the dielectric layer and the plug material in a method of manufacturing a semiconductor device, according to an exemplary embodiment of the present invention. Referring to FIG. 8, the dielectric layer 160 and the plug material 150 are planarized down to top surfaces of the spacer layers 121 corresponding to the gate regions. The planarization is performed using an appropriate planarization technique, such as, for example, chemical mechanical planarization (CMP).

Figure 9:
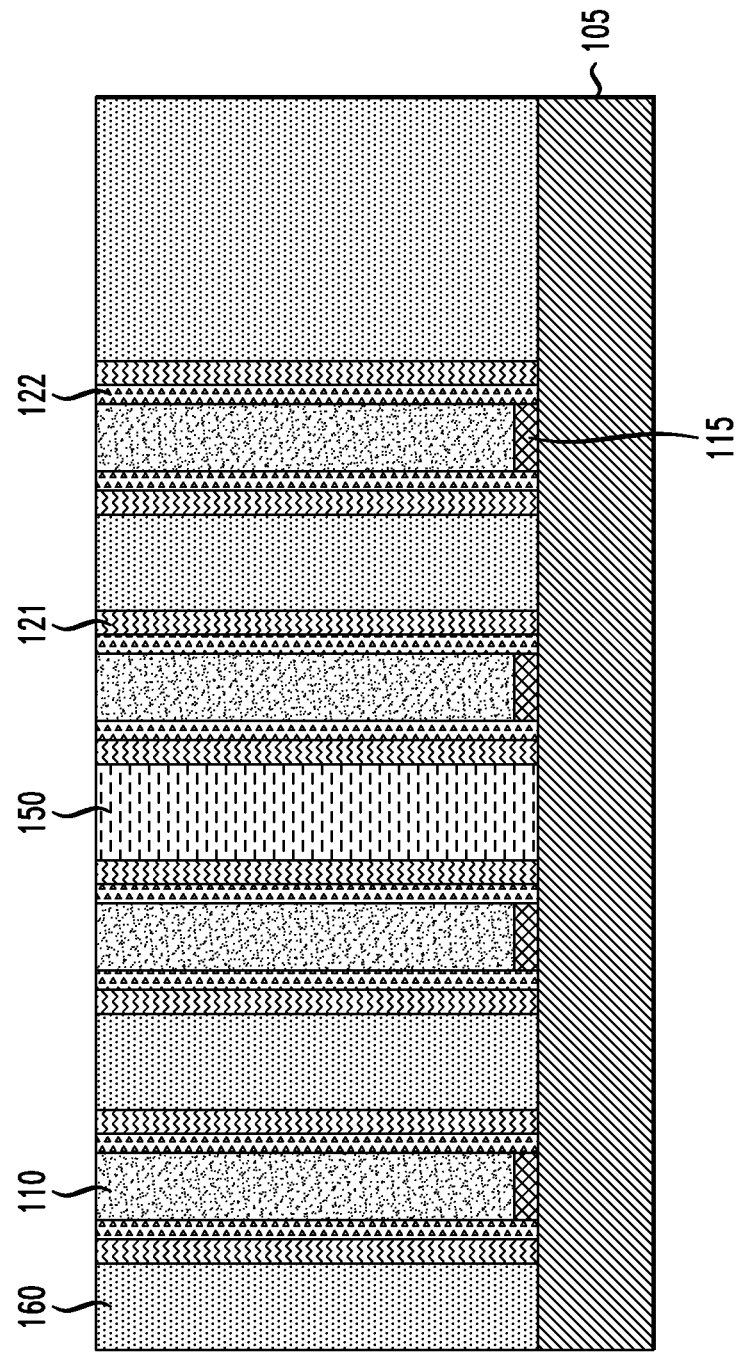
FIG. 9 is a cross-sectional view illustrating additional planarization or removal of portions of the dielectric layer and the plug material, and of portions of spacer layers on top surfaces of the sacrificial gates in a method of manufacturing a semiconductor device, according to an exemplary embodiment of the present invention.

FIG. 9 is a cross-sectional view illustrating additional planarization or removal of portions of the dielectric layer and the plug material, and of portions of spacer layers on top surfaces of the sacrificial gates in a method of manufacturing a semiconductor device, according to an exemplary embodiment of the present invention. Referring to FIG. 9, additional planarization or etching is performed to remove portions of the spacer layers 121 on the sacrificial gates 110 so that the sacrificial gates 110 are exposed. The additional planarization or non-selective etching removes portions of the dielectric layer 160 and plug material 150 at a greater height over than the fin than the sacrificial gates 110. CMP, for example, can be used to perform the additional planarization. After planarization, etching to remove the portions of the spacer layers 121 on the sacrificial gates 110 may also need to be performed using, for example, a RIE process including any combination of $CF_4$, $C_4F_6$, $C_4F_8$, $CH_3F$, with, for example, $O_2$ and/or Ar to expose the sacrificial gates 110.

Figure 10:
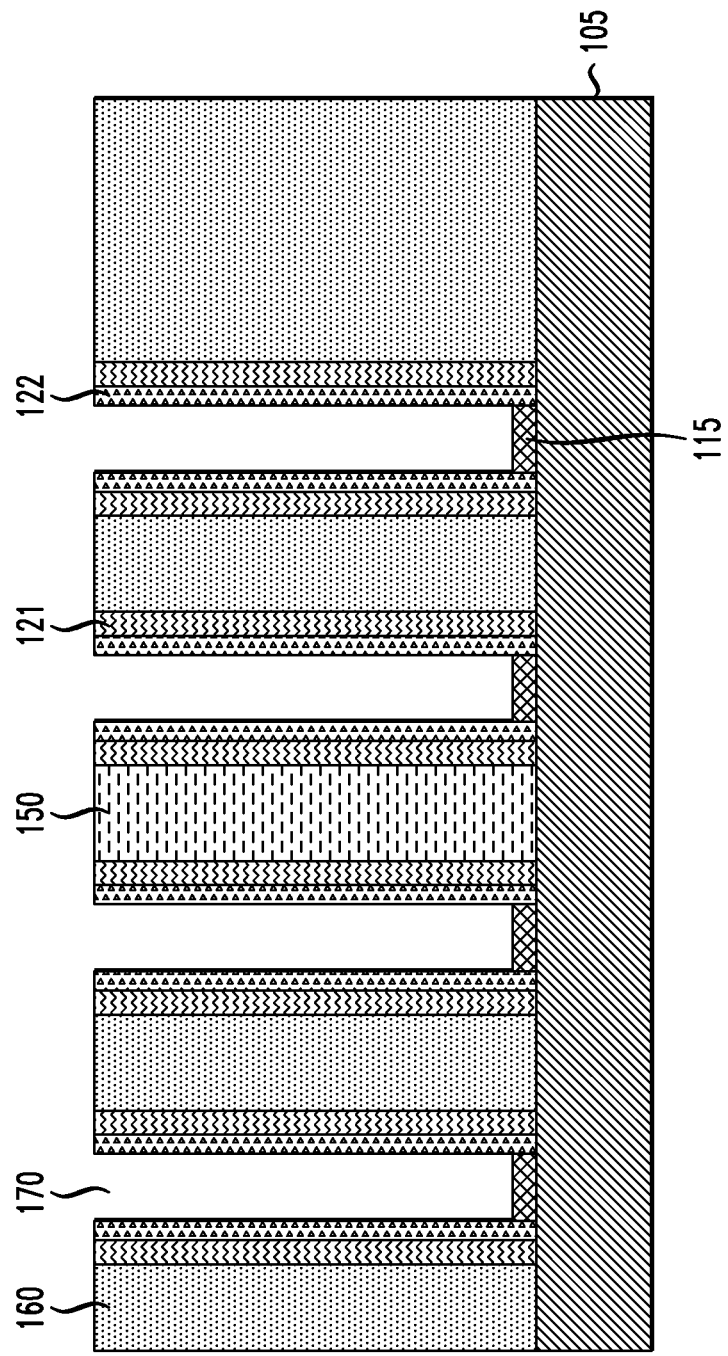
FIG. 10 is a cross-sectional view illustrating selective removal of the sacrificial gates in a method of manufacturing a semiconductor device, according to an exemplary embodiment of the present invention.

FIG. 10 is a cross-sectional view illustrating selective removal of the sacrificial gates in a method of manufacturing a semiconductor device, according to an exemplary embodiment of the present invention. Referring to FIG. 10, the sacrificial gates 110 are removed. The removal is selective to the spacer and liner layers 121, 122 and the remaining plug portion 150. The removal is performed using, for example, a ME process using HBr or $Cl_2$-based chemistries, or a wet etch process in which a variety of chemistries may be used. The removal process selectively removes the material of the sacrificial gates 110 (e.g., a-Si or polycrystalline silicon) with respect to the materials of the spacer and liner layers 121, 122 and the remaining plug portion 150.

Figure 11:
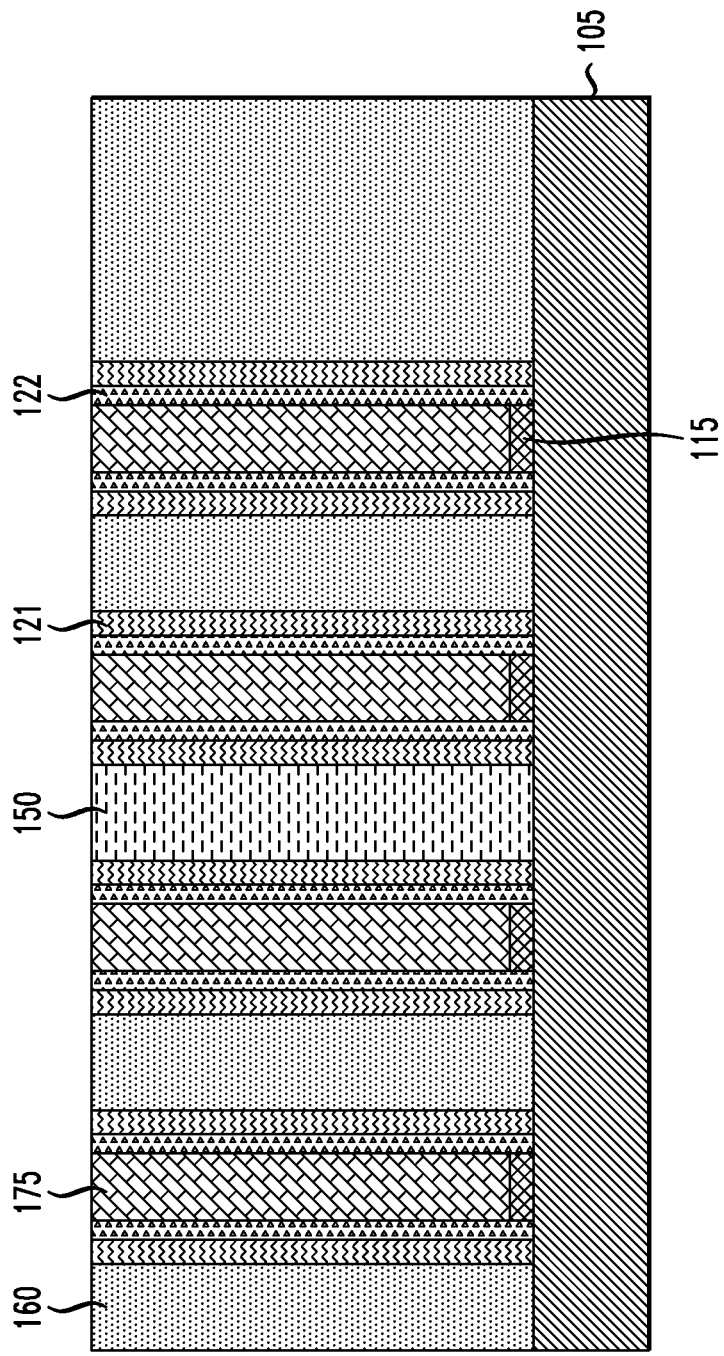
FIG. 11 is a cross-sectional view illustrating replacement of the removed sacrificial gates with gate structures in a method of manufacturing a semiconductor device, according to an exemplary embodiment of the present invention.

FIG. 11 is a cross-sectional view illustrating replacement of the removed sacrificial gates with gate structures in a method of manufacturing a semiconductor device, according to an exemplary embodiment of the present invention. Referring to FIG. 11, gate structures 175 including, for example, high-K dielectric, work function metal and gate metal layers are deposited in the areas 170 previously occupied by the removed sacrificial gates 110.

The high-K dielectric layer includes, but is not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other dielectric. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The work-function metal (WFM) layer, includes but is not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate metal layer includes, but is not necessarily limited to, metals, such as, for example, tungsten, cobalt, zirconium, tantalum, titanium, aluminum, ruthenium, and/or copper, metal carbides, metal nitrides, transition metal aluminides, tantalum carbide, titanium carbide, tantalum magnesium carbide, or combinations thereof deposited on the WFM layer.

Figure 12:
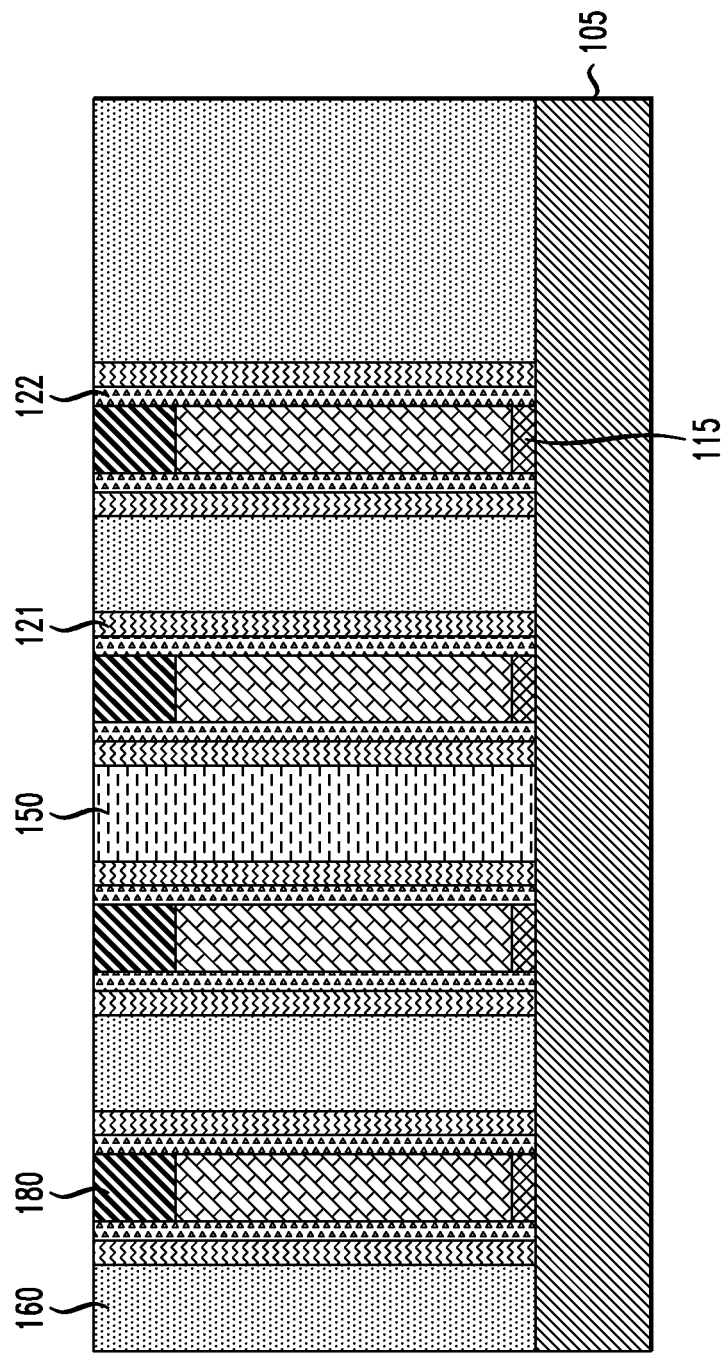
FIG. 12 is a cross-sectional view illustrating recessing of the gate structures and deposition of a hardmask material on the recessed gate structures in a method of manufacturing a semiconductor device, according to an exemplary embodiment of the present invention.

FIG. 12 is a cross-sectional view illustrating recessing of the gate structures and deposition of a hardmask material on the recessed gate structures in a method of manufacturing a semiconductor device, according to an exemplary embodiment of the present invention. Referring to FIG. 12, the gate structures 175 are recessed to a height below the top surface of the dielectric layer 160. The recessing is performed using, for example, an etch process. Hardmasks 180 including, for example, silicon oxycarbide (SiOC), are deposited on the recessed gate structures 175. The hardmasks 180 are deposited using a deposition technique, such as, but not necessarily limited to, CVD, PECVD, RFCVD, PVD, ALD, MLD, MBD, PLD, LSMCD, and/or sputtering.

Figure 13:
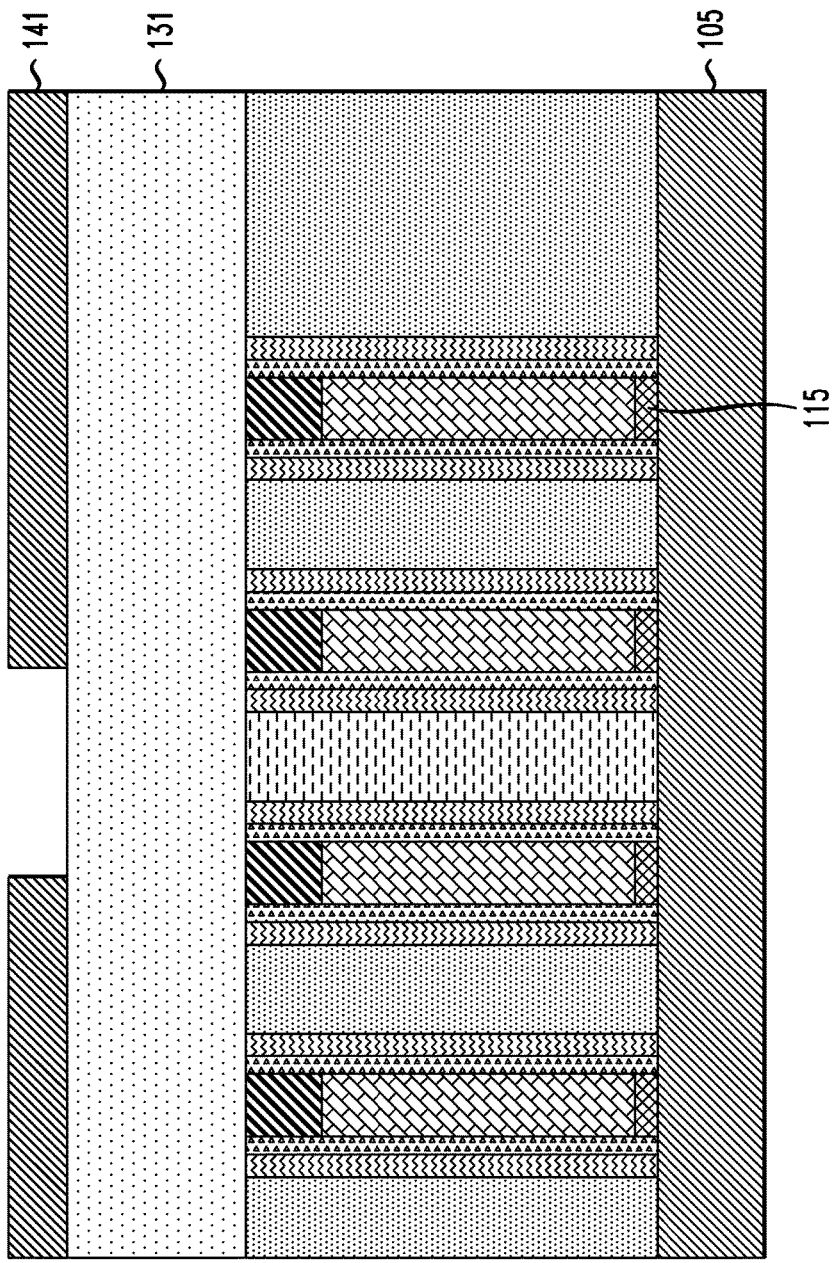
FIG. 13 is a cross-sectional view illustrating deposition of an OPL and a mask on the structure from FIG. 12 in a method of manufacturing a semiconductor device, according to an exemplary embodiment of the present invention.

FIG. 13 is a cross-sectional view illustrating deposition of an OPL and a mask on the structure from FIG. 12 in a method of manufacturing a semiconductor device, according to an exemplary embodiment of the present invention. Referring to FIG. 13, similar to what is described in connection with FIG. 2, an OPL 131 is deposited on the structure from FIG. 12, including the top surfaces of the dielectric layer 160, the spacer and liner layers 121, 122, the hardmasks 180 and the plug portion 150. In accordance with an embodiment of the present invention, the OPL material may be an organic polymer including C, H, and N. In an embodiment, the OPL material can be free of silicon (Si) or free of Si and fluorine (F). The OPL 131 can be deposited, for example, by spin coating.

A mask 141 is formed on the OPL 131 exposing portions of the OPL 130 where the plug portion 150 and where a contact portion, such as a source/drain contact portion is to be formed. The mask 141 can be, for example, a photoresist used in connection with lithography, and exposed portions of the OPL 131 can be removed based on the pattern of the mask 141.

Figure 14:
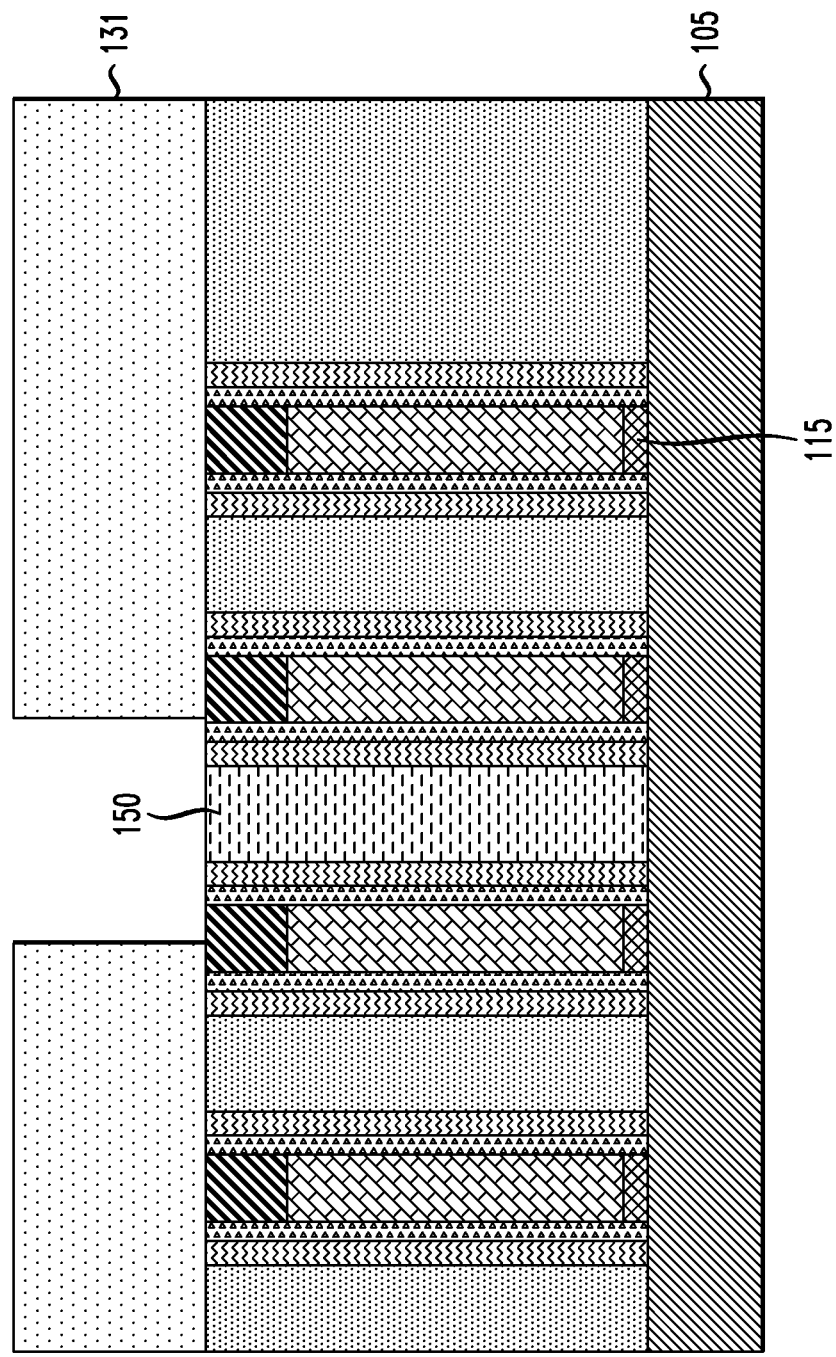
FIG. 14 is a cross-sectional view illustrating selective removal of a portion of the OPL to form an opening exposing the plug material in a method of manufacturing a semiconductor device, according to an exemplary embodiment of the present invention.

FIG. 14 is a cross-sectional view illustrating selective removal of a portion of the OPL to form an opening exposing the plug material in a method of manufacturing a semiconductor device, according to an exemplary embodiment of the present invention. Referring to FIG. 14, the exposed portions of the OPL 131 are removed to expose the plug portion 150 between two gate structures 175. The removal of the exposed portions of the OPL 131 can be performed using, for example, an anisotropic removal process, such as, for example, an RIE process, which is selective to materials of the hardmasks 180, spacer and liner layers 121, 122 and the plug portion 150. For example, the etching is performed using $N_2/H_2$, $O_2$, $CO_2$, CO, or some combination thereof, which selectively etches the OPL 131 with respect to the hardmasks 180, spacer and liner layers 121 and 122, and the plug portion 150. The removal of the portion of the OPL 131 exposes a top surface of the plug portion 150.

Figure 15:
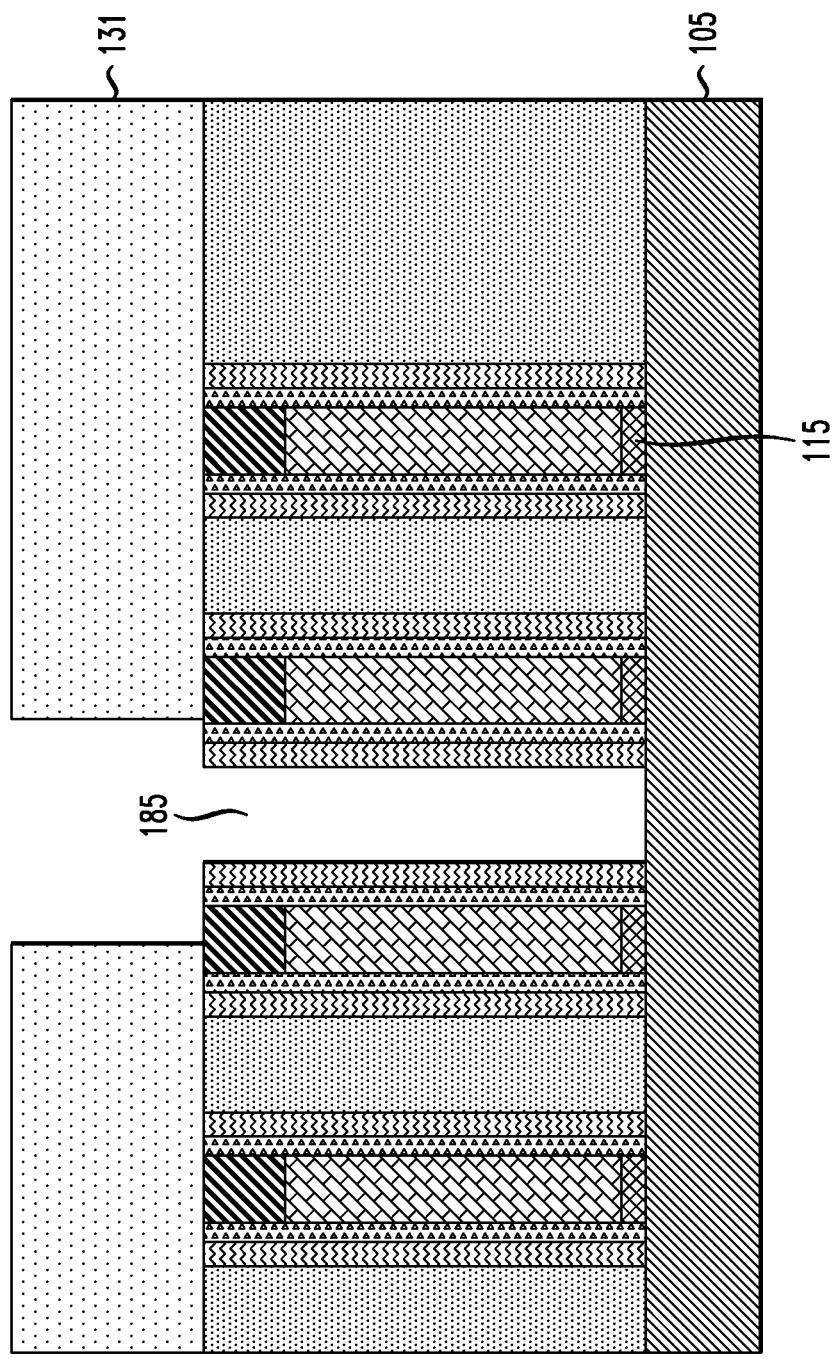
FIG. 15 is a cross-sectional view illustrating selective removal of the plug material where a contact is to be formed in a method of manufacturing a semiconductor device, according to an exemplary embodiment of the present invention.

FIG. 15 is a cross-sectional view illustrating selective removal of the plug material where a contact is to be formed in a method of manufacturing a semiconductor device, according to an exemplary embodiment of the present invention. Referring to FIG. 15, the exposed plug portion 150 is removed to form a vacant area 185 between two gate structures 175 down to a top surface of the fin 105. The removal of the exposed plug portion 150 can be performed using, for example, a highly selective wet or plasma etch, which is selective to materials of the spacer and liner layers 121, 122 and the material of the hardmasks 180. For example, the etching is performed using a combination of $CF_4$, $C_4F_6$, $C_4F_8$, $CH_3F$ with, for example, $O_2$ and/or Ar, which is formulated to selectively etch the plug portion 150 (e.g., $Si_3N_4$) with respect to the spacer and liner layers 121 and 122 (e.g., SiBCN and SiOCN), and the hardmasks 180 (e.g., SiOC).

Figure 16:
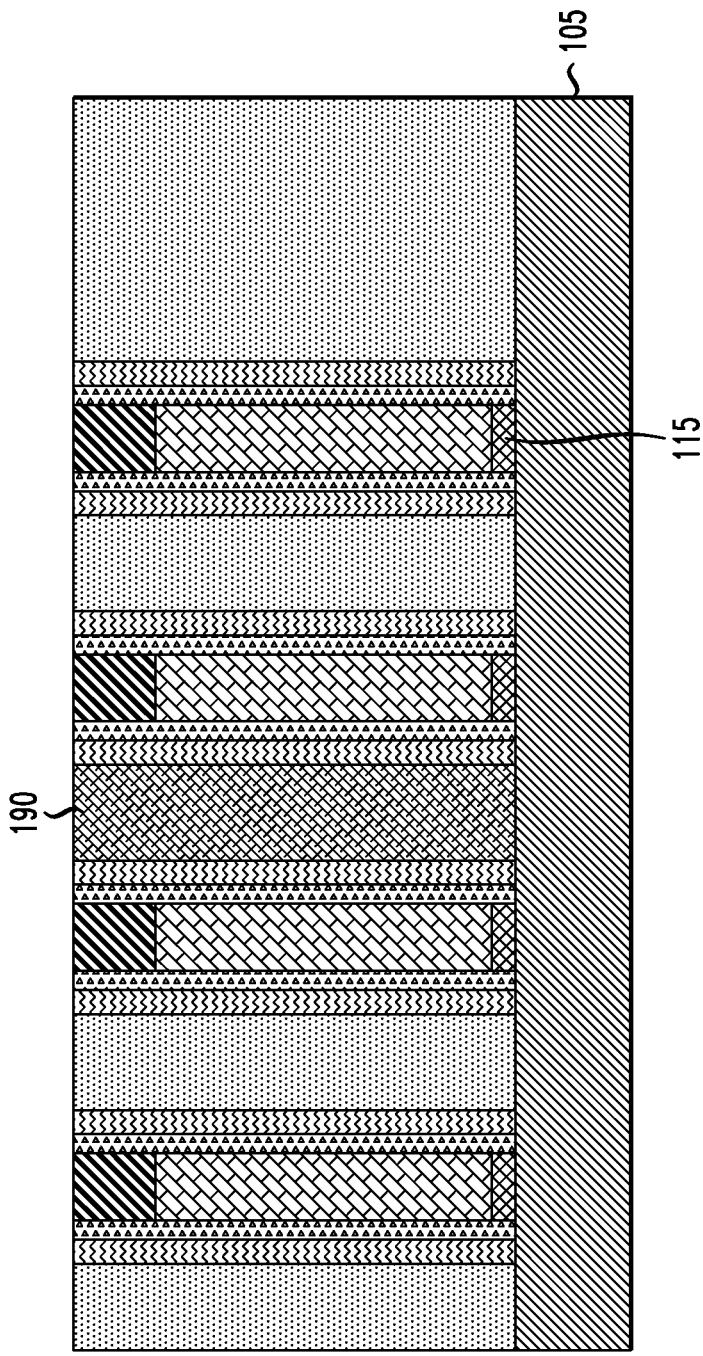
FIG. 16 is a cross-sectional view illustrating selective removal of remaining portions of the OPL and deposition of a contact layer in a method of manufacturing a semiconductor device, according to an exemplary embodiment of the present invention.

FIG. 16 is a cross-sectional view illustrating selective removal of remaining portions of the OPL and deposition of a contact layer in a method of manufacturing a semiconductor device, according to an exemplary embodiment of the present invention. Referring to FIG. 16, the remaining OPL 131 is removed from the top surfaces of the dielectric layer 160, the spacer and liner layers 121, 122 and the hardmasks 180 using, for example, an ashing process the same or similar to what is described in connection with FIG. 6.

A contact layer 190 is deposited in the area 185 where the plug portion 150 was removed and on the top surfaces of the dielectric layer 160, the spacer and liner layers 121, 122 and the hardmasks 180. The contact layer 190 can be deposited using a deposition technique including, but not necessarily limited to, CVD, PECVD, RFCVD, PVD, ALD, MLD, MBD, PLD, LSMCD, and/or sputtering. Excessive portions of the contact layer 190 deposited on the top surfaces of the dielectric layer 160, the spacer and liner layers 121, 122 and the hardmasks 180 can be removed using a planarization process, such as, for example, CMP, to result in the structure shown in FIG. 16. The contact layer 190 includes, for example, electrically conductive material including, for example, copper (Cu), nickel (Ni), cobalt (Co), iron (Fe), gold (Au), silver (Ag), ruthenium (Ru), palladium (Pd), platinum (Pt), iridium (Ir), tungsten (W), and any mixtures or alloys thereof.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a plurality of gate structures spaced apart from each other on a fin;
   forming an inorganic plug portion on the fin between at least two gate structures of the plurality of gate structures;
   forming a dielectric layer on the fin and between remaining gate structures of the plurality of gate structures;
   forming an organic planarizing layer (OPL) on the plurality of gate structures and on the inorganic plug portion;
   removing a portion of the OPL to expose the inorganic plug portion;
   selectively removing the inorganic plug portion; and
   forming a contact on the fin in place of the removed inorganic plug portion.

2. The method according to claim 1, wherein at least one of a spacer layer and a liner layer is formed on each of the plurality of gate structures.

3. The method according to claim 2, wherein the inorganic plug portion is selectively removed with respect to a material of at least one of the spacer layer and the liner layer.

4. The method according to claim 3, wherein the inorganic plug portion comprises $Si_3N_4$ and the spacer layer comprises silicon-oxygen-boron-nitride (SiBCN).

5. The method according to claim 3, wherein the inorganic plug portion comprises $Si_3N_4$ and the liner layer comprises silicon-oxygen-carbon-nitride (SiOCN).

6. The method according to claim 1, wherein a hardmask layer is formed on each of the plurality of gate structures.

7. The method according to claim 6, wherein the inorganic plug portion is selectively removed with respect to a material of the hardmask layer.

8. The method according to claim 7, wherein the inorganic plug portion comprises $Si_3N_4$ and the hardmask layer comprises silicon oxycarbide (SiOC).

9. The method according to claim 1, wherein the OPL is further formed on the dielectric layer.

10. A method for manufacturing a semiconductor device, comprising:
    forming a plurality of sacrificial gates spaced apart from each other on a fin;
    depositing an organic planarizing layer (OPL) on the fin and between the plurality of sacrificial gates;
    removing a portion of the OPL from between at least two sacrificial gates of the plurality of sacrificial gates;
    forming an inorganic plug portion on the fin in an area where the portion of the OPL was removed;
    removing a remaining portion of the OPL;
    depositing a dielectric layer on the fin and between the plurality of sacrificial gates where the OPL was removed;
    replacing the plurality of sacrificial gates with a plurality of gate structures;
    selectively removing the inorganic plug portion; and
    forming a contact on the fin in place of the removed inorganic plug portion.

11. The method according to claim 10, further comprising:
    forming an additional organic planarizing layer (OPL) on the plurality of gate structures and on the inorganic plug portion;
    removing a portion of the additional OPL to expose the inorganic plug portion prior to selectively removing the inorganic plug portion.

12. The method according to claim 11, wherein the additional OPL is further formed on the dielectric layer.

13. The method according to claim 10, wherein at least one of a spacer layer and a liner layer is formed on each of the plurality of gate structures.

14. The method according to claim 13, wherein the inorganic plug portion is selectively removed with respect to a material of at least one of the spacer layer and the liner layer.

15. The method according to claim 14, wherein the inorganic plug portion comprises $Si_3N_4$ and the spacer layer comprises silicon-oxygen-boron-nitride (SiBCN).

16. The method according to claim 14, wherein the inorganic plug portion comprises $Si_3N_4$ and the liner layer comprises silicon-oxygen-carbon-nitride (SiOCN).

17. The method according to claim 10, wherein a hardmask layer is formed on each of the plurality of gate structures.

18. The method according to claim 17, wherein the inorganic plug portion is selectively removed with respect to a material of the hardmask layer.

19. The method according to claim 18, wherein the inorganic plug portion comprises $Si_3N_4$ and the hardmask layer comprises silicon oxycarbide (SiOC).

20. A method for manufacturing a transistor device, comprising:
    forming a plurality of gate structures spaced apart from each other on a channel region;
    forming a plug portion on the channel region between at least two gate structures of the plurality of gate structures;
    forming a dielectric layer on the channel region and between remaining gate structures of the plurality of gate structures;
    forming an organic planarizing layer (OPL) on the plurality of gate structures, the plug portion and the dielectric layer;
    removing a portion of the OPL to expose the plug portion;
    selectively removing the plug portion; and
    forming a contact on a fin in place of the removed plug portion.

* * * * *